United States Patent [19]

Hoffmann

[11] 4,000,427
[45] Dec. 28, 1976

[54] STATIC THREE-TRANSISTOR-STORAGE ELEMENT

[75] Inventor: Kurt Hoffmann, Taufkirchen, Germany

[73] Assignee: Siemens Aktiengesellschaft, Berlin & Munich, Germany

[22] Filed: Apr. 21, 1976

[21] Appl. No.: 679,089

[30] Foreign Application Priority Data

Apr. 30, 1975 Germany .......................... 2519323

[52] U.S. Cl. ............................... 307/238; 307/279; 307/290; 340/173 FF
[51] Int. Cl.² ................. G11C 11/40; H03K 3/295; H03K 3/353
[58] Field of Search .................. 307/238, 279, 290; 340/173 AM, 173 FF

[56] References Cited

UNITED STATES PATENTS

| 3,441,912 | 4/1969 | Henle ........................... 307/238 X |
| 3,449,727 | 6/1969 | Pricer ........................... 307/238 X |
| 3,870,901 | 3/1975 | Smith ............................... 307/238 |

OTHER PUBLICATIONS

Pleshko, "Low–Power Flip–Flop," IBM Tech. Discl. Bull., vol. 9, No. 5, pp. 553–554, Oct. 1966.

Primary Examiner—John S. Heyman
Assistant Examiner—Larry N. Anagnos
Attorney, Agent, or Firm—Hill, Gross, Simpson, Van Santen, Steadman, Chiara & Simpson

[57] ABSTRACT

A three-transistor storage element is disclosed which includes a first load element, a first field effect transistor and a second load element connected in series between first and second terminal lines of a voltage supply. Node points are located at opposite ends of the first transistor in the series path between the first load element and the first transistor and between the second load element and the first transistor. A second field effect transistor is connected between the first terminal line and the second node point. The gate of said second transistor is connected to the first node point. The gate of the first transistor is connected to a reference voltage. An address field effect transistor is connected between a bit line and the second node point and the gate of said address transistor is connected to a word line. A modified form of this storage element is one in which the load elements are in the form of fourth and fifth field effect transistors. The gates of these fourth and fifth field effect transistors are connected to the source of each of the fourth and fifth transistors, respectively. A third form of the present invention has the gates of the address transistor and the gate of the first transistor connected together and to the word line. A fourth form of the invention has the gates of the first and fifth transistors and the address transistor connected together to the word line.

8 Claims, 5 Drawing Figures

STATIC THREE-TRANSISTOR-STORAGE ELEMENT

BACKGROUND OF THE INVENTION

This invention relates to a static three-transistor storage element. Static storage elements have the advantage that they require no pulse train voltages. Static storage elements, however, require a relatively large amount of surface space, and for this reason, are usually considered unsuitable for large scale integration, such for example, as the stores having a capacity of 1,024 bits.

SUMMARY OF THE INVENTION

It is an object of the present invention to provide a static three-transistor storage element which possesses a particularly low space requirement in relation to the known storage elements. This object is obtained further by providing a circuit which enables it to be constructed as a part of an integrated circuit in which only one contact hole is required for the construction of the storage element.

A still further aspect of the novel circuit is that three transistors can be arranged beneath a common gate in constructing it as an integrated circuit.

DESCRIPTION OF THE PREFERRED EMBODIMENTS

Figure 1:
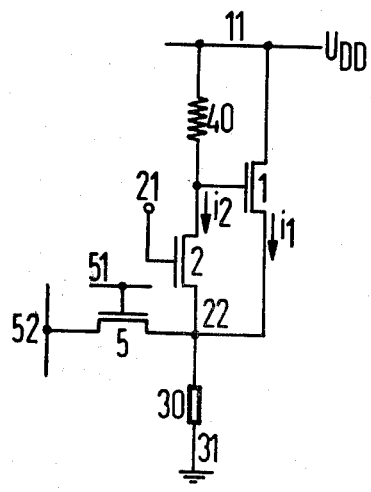
FIG. 1 shows the circuit diagram of a three-transistor storage element in accordance with the invention.

The static storage element in accordance with the invention which is illustrated in FIG. 1 consists of the three transistors 1, 2 and 5, and of the load elements 30 and 40. Here the load element 40, the transistor 2, and the load element 30 are connected in series in the manner shown in FIG. 1. The load element 40 is connected on the one hand to the first supply voltage terminal 11, and on the other hand to the node 23 of the storage element.

To simplify the description and to facilitate the description of the present invention, the phrase "drain- and source" and the phrase "source- and drain" are to be understood to mean that when the voltage supply line is positive with respect to ground or other reference level negative with respect to the voltage supply line, the first word of the phrase is to be considered applicable and the second word is to be disregarded. When the voltage supply line is negative with respect to ground, the second word of the phrase is to be considered applicable and the first word disregarded. For example, but not by way of limitation, when the voltage supply line is positive with respect to ground in the various figures of the drawings, the upper ends of each of transistors 1 and 2 are the drain and the lower ends are the source.

The drain- and source terminal of the transistor 2 is also connected to the node 23. The drain- and source terminal of this transistor 2 is connected at the node 22 to the one terminal of the load element 30. The other terminal of this load element 30 is connected to the second supply voltage terminal 31, which is preferably connected to earth. The node 23 is also connected to the gate terminal of the transistor 1. The source- and drain terminal of this transistor is connected to the node 22, and the drain- and source terminal is connected to the first supply voltage terminal 11. The node 22 is connected via the address transistor 5 to the bit line 52. The address transistor 5 is operated via the word line 51, which for this purpose is connected to its gate terminal. A reference voltage $U_R$ can be connected to the gate terminal 21 of the transistor 2.

The interconnection, provided in accordance with the invention, of the transistors 1 and 2 and of the load elements 30 and 40 produces a bistable arrangement, whose function is to be described in the following. Here it has been assumed that the transistors 1, 2 and 5 are n-channel MOS field effect transistors of the enhancement type. However, they can also be P-channel MOS field effect transistors, in which case, however, the potentials of the opposite polarity are connected.

The circuit shown in FIG. 1 can assume two static states. If one of these states occurs, the transistor 1 blocks and the transistor 2 goes conductive. This means that the current $i_1 = 0$. If the other state occurs, the transistor 2 blocks and the transistor 1 goes conductive. This means that the current $i_2 = 0$. In this case ($i_2 = 0$), the node 23 is brought to the supply potential $U_{DD}$. This causes the transistor 1 to open, and the current $i_1$ flowing across it produces, at the point 22, a potential $U_P = U_{DD} - U_T$ which blocks the transistor 2 as $U_P > (U_R - U_T)$. In this formula, $U_R$ is the reference voltage which is connected to the gate terminal 21 of the transistor 2, and $U_T$ is the start voltage of the transistor 2.

In the other static state ($I_1 = 0$), the transistor 1 blocks. To this end, the voltage $U_{GS}$ between the source terminal and the gate terminal of the transistor 1 must possess the value $U_{GS} = (U_N - U_P) < U_T$. Here the voltage $U_{GS}$ is determined from the ratio of the resistances and the supply voltage $U_{DD}$ in accordance with the formula $$U_{GS} = U_N - U_P = U_{DD} \cdot \frac{r}{R_{40} + R_{30} + r}$$

where $r$ is the resistance of the conductive transistor 2, $R_{30}$ is the resistance of the load element 30, $R_{40}$ is the resistance of the load element 40, and $U_N$ is the potential across the node 23. In this case, a potential of $U_P = i_2 R_{30}$ prevails across the point 22.

With the aid of the address transistor 5, the storage element can be switched into the one or the other static state. This is effected in that the transistor 5 is switched conductive via the word line 51, as a result of which the digital information, present in the form of a different voltage across the bit line 52, passes to the node 22. If the node 22 is now brought to a potential of $U_{DD}$, the element assumes the static state $i_2 = 0$. If, on the other hand, the node 22 is connected to earth potential, the static state $i_1 = 0$ is set up. If the address transistor 5 is subsequently switched non-conductive via the word line 51, the state written into the element is retained.

On the read-out of the information or the state from the element, the address transistor 5 is switched conductive via the word line 51. The potential connected to the node point 22 is thereby passed to the bit line 52 where it can be read-out with the aid of an evaluator known per se. Evaluator circuits which serve to evaluate the potentials present across the node point 22 are described, for example, in the publication "Storage Array and Sense Refresh Circuit for Single Transistor Memory Cells", Dr. Stein, Sihling and Doering, IEEE Journal of Solid State Circuits, October, 1972.

Figure 2:
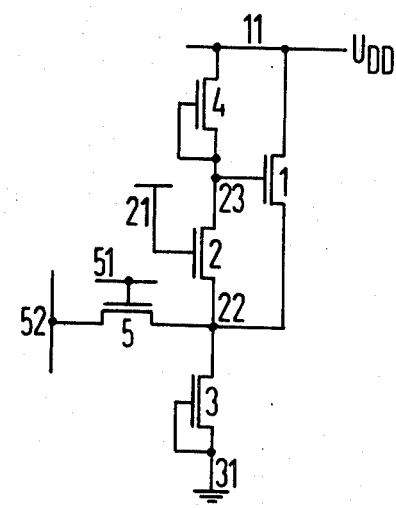
FIG. 2 shows a circuit variant of the circuit shown in FIG. 1.

FIG. 2 illustrates a variant of the circuit shown in FIG. 1, in which the transistors 1 and 5 are of the enhancement type and the transistor 2 is of the depletion type. The load elements 30 and 40, which in FIG. 1 are in the form of resistors, are replaced by MOS field effect transistors 3 and 4 of the depletion type. Here the gate terminal of the transistor 4 is connected to the nodal point 23, and the gate terminal of the transistor 3 is connected to the terminal 31. The use of MOS field effect transistors of the depletion type as load elements has the advantage that the arrangement can be integrated more easily and that the reference voltage $U_R$ is not required. The reason for this is that the transistor 2 can be conductive when the gate terminal 22 is connected to earth potential.

Figure 3:
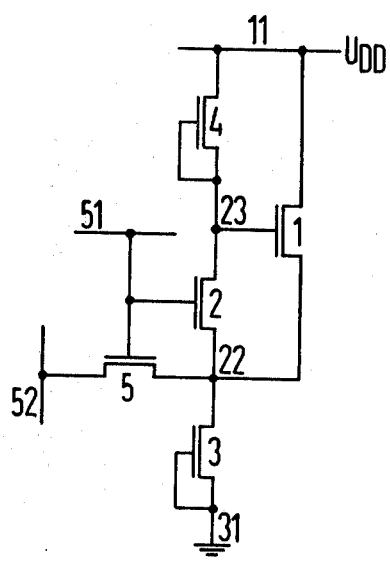
FIG. 3 shows a circuit variant of the circuit shown in FIG. 2.

In the circuit variant in FIG. 3, in which the transistors 1 and 5 are of the enhancement type and the transistors 2, 3 and 4 are of the depletion type, the gate terminal of the transistor 2, and also the gate terminal of the address transistor 5 are connected to the word line 51.

Figure 4:
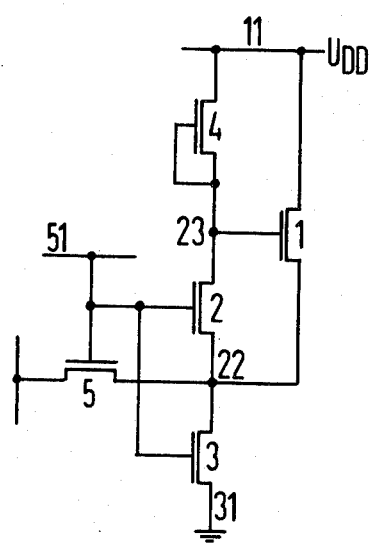
FIG. 4 shows another circuit variant of the circuit shown in FIG. 2.

The circuit variant in FIG. 4 differs from the circuit in FIG. 3 in that the gate of the transistor 3 is also connected to the word line 51.

The circuit variants in FIGS. 3 and 4 have the advantage that the design can be further simplified by means of a common gate connection and thus facilitates incorporation in an integrated circuit.

The mode of functioning of the circuits shown in FIGS. 2 to 4 corresponds to the mode of functioning already described above in association with FIG. 1.

Figure 5:
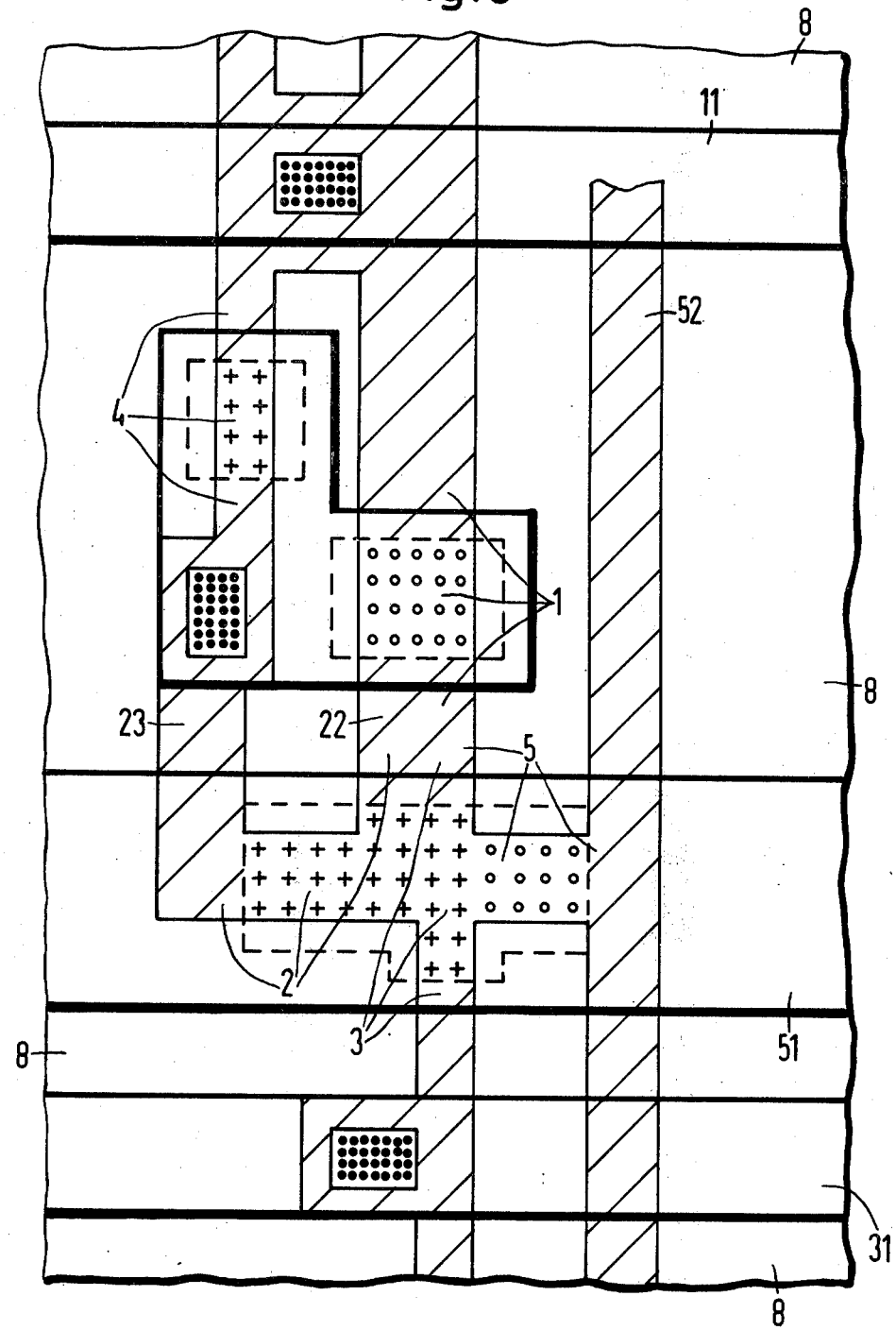
FIG. 5 shows diagrammatically the construction of the storage element of FIG. 4 as an integrated circuit.

In FIG. 5, the layout of the circuit arrangement shown in FIG. 4 in an aluminum-gate-technique is represented. Details of FIG. 5 which have already been described in association with the other Figures bear the corresponding reference characters. The diffusion paths or diffusion zones arranged in the semiconductor material are indicated by shaded areas. Unshaded areas with thick-line borders represent the overlying aluminum conductor paths and conductor zones. The electrical insulating layer arranged between the aluminum and the semiconductor body has not been shown for the sake of simplicity. Dotted areas represent the contact holes between an aluminum conductor path or an aluminum zone and a diffusion zone in the semiconductor body. Transistors of the depletion type are represented by areas marked with crosses. Transistors of the enhancement type are represented by areas shown in small circles.

In the case of the use of p-channel transistors, the shaded zones are p-doped and the unshaded zones of the semiconductor substrate 8 are n-doped.

It will be apparent to those skilled in the art that many modifications and variations may be effected without departing from the spirit and scope of the novel concepts of the present invention.

I claim as my invention:

1. A three-transistor storage element, comprising a first and a second load element, a first field effect transistor connected in series with said load elements, one terminal of said first load element being connected to a first terminal line of a voltage supply, the other terminal of the first load element being connected to a node of the storage element, the drain- and source terminal of the first transistor being connected to said node, the source- and drain terminal of said first transistor being connected at a second node to one terminal of said second load elememt, the other terminal of said second load element being connected to a second terminal line of said voltage supply having a different potential level from said first terminal line and between which terminal lines said storage element is connected, a second field effect transistor, the drain and source terminal of said second transistor being connected to said first voltage line, the source and drain terminal of said second transistor being connected to said second node at which said second load element and said first transistor are connected to one another, the gate terminal of said second transistor being connected to said first node, said second node being connected via an address field effect transistor to a bit line, and the gate terminal of said address transistor being connected to a word line.

2. A circuit as claimed in claim 1, in which said load elements are resistors, and in which said first, second and third transistors are of the enhancement type, a reference potential being connected to the gate terminal of said first transistor and said address transistor being connected to said second node.

3. A circuit as claimed in claim 1, in which said load elements are field effect transistors of the depletion type, the gate terminals of these field effect transistors being connected to their respective source- and drain terminals, said second transistor and said address transistor being of the enhancement type, and first transistor being of the depletion type.

4. A circuit as claimed in claim 3, in which said address transistor is connected on the one hand to a bit line and on the other hand to said second node, and in which a word line is connected to the gate terminal of said address transistor and to the gate terminal of said first transistor.

5. A circuit as claimed in claim 3, in which said load elements are fourth and fifth field effect transistors, respectively, of the depletion type, the gate terminal of said fourth field effect transistor being connected to the source- and drain terminal, that the second transistor and the address transistor are of the enhancement type, said first transistor being of the depletion type, the address transistor being connected on the one hand to a bit line and on the other hand to said second node, and the gate terminals of the first, third and fifth transistors being connected to a word line.

6. A circuit as claimed in claim 1, in which the transistors are metal oxide semiconductor field effect transistors.

7. A circuit as claimed in claim 2, in which the transistors are metal oxide semiconductor field effect transistors.

8. A three-transistor storage element comprising a first and second load element, a first n-channel field effect transistor connected in series with said load elements, one terminal of said first load element being connected to a source of positive voltage, the other terminal of said first load element being connected at a first node of the storage element, the drain terminal of said first transistor being connected to said node, the source terminal of said first transistor being connected at a second node to one terminal of said second load element, the other terminal of said second load element being connected to ground, the drain terminal of said second transistor being connected to said source of positive voltage, the source terminal of said second transistor being connected to said second node, at which said second load element and said first transistor are connected to one another, the gate terminal of said second transistor being connected to said first node, said second node being connected by an address field effect transistor of the enhancement type to a bit line, and the gate terminal of said address transistor being connected to a word line.

* * * * *